(12) United States Patent
Li et al.

(10) Patent No.: US 10,763,366 B2
(45) Date of Patent: Sep. 1, 2020

(54) V-SHAPE RECESS PROFILE FOR EMBEDDED SOURCE/DRAIN EPITAXY

(71) Applicant: Taiwan Semiconductor Manufacturing Co., Ltd., Hsin-Chu (TW)

(72) Inventors: Chii-Horng Li, Zhubei (TW); Chih-Shan Chen, New Taipei (TW); Roger Tai, Tainan (TW); Yih-Ann Lin, Jhudong Township (TW); Yen-Ru Lee, Hsinchu (TW); Tzu-Ching Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/654,906

(22) Filed: Oct. 16, 2019

(65) Prior Publication Data

US 2020/0052121 A1   Feb. 13, 2020

Related U.S. Application Data

(60) Division of application No. 16/048,822, filed on Jul. 30, 2018, which is a continuation of application No. (Continued)

(51) Int. Cl.
| | | |
|---|---|---|
| H01L 27/088 | (2006.01) | |
| H01L 29/78 | (2006.01) | |
| H01L 21/3065 | (2006.01) | |
| H01L 29/06 | (2006.01) | |
| H01L 29/08 | (2006.01) | |
| H01L 29/66 | (2006.01) | |

(52) U.S. Cl.
CPC ...... *H01L 29/7851* (2013.01); *H01L 21/3065* (2013.01); *H01L 29/0653* (2013.01); *H01L 29/0847* (2013.01); *H01L 29/66795* (2013.01); *H01L 29/7848* (2013.01)

(58) Field of Classification Search
None
See application file for complete search history.

(56) References Cited

U.S. PATENT DOCUMENTS

| | | |
|---|---|---|
| 7,425,740 B2 | 9/2008 | Liu et al. |
| 8,048,723 B2 | 11/2011 | Chang et al. |

(Continued)

FOREIGN PATENT DOCUMENTS

| | | |
|---|---|---|
| CN | 104183542 A | 12/2014 |
| TW | 201114039 A | 4/2011 |

(Continued)

*Primary Examiner* — Calvin Y Choi
(74) *Attorney, Agent, or Firm* — Haynes and Boone, LLP

(57) ABSTRACT

A semiconductor device includes a semiconductor base. A dielectric isolation structure is formed in the semiconductor base. A source/drain of a FinFET transistor is formed on the semiconductor base. A bottom segment of the source/drain is embedded into the semiconductor base. The bottom segment of the source/drain has a V-shaped cross-sectional profile. The bottom segment of the source/drain is separated from the dielectric isolation structure by portions of the semiconductor base.

20 Claims, 7 Drawing Sheets

Related U.S. Application Data

15/235,899, filed on Aug. 12, 2016, now Pat. No. 10,038,095.

(60) Provisional application No. 62/287,972, filed on Jan. 28, 2016.

(56) References Cited

U.S. PATENT DOCUMENTS

| | | |
|---|---|---|
| 8,053,299 B2 | 11/2011 | Xu |
| 8,183,627 B2 | 5/2012 | Currie |
| 8,415,718 B2 | 4/2013 | Xu |
| 8,487,378 B2 | 7/2013 | Goto et al. |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,729,634 B2 | 5/2014 | Shen et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 8,826,213 B1 | 9/2014 | Ho et al. |
| 8,887,106 B2 | 11/2014 | Ho et al. |
| 2005/0127473 A1 | 6/2005 | Sakagami |
| 2012/0161238 A1 | 6/2012 | Scheiper et al. |
| 2012/0168821 A1* | 7/2012 | Cheng ............ H01L 21/823412 257/192 |
| 2013/0122685 A1 | 5/2013 | Kim |
| 2013/0228875 A1* | 9/2013 | Lee .................. H01L 29/66795 257/401 |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2014/0282326 A1 | 9/2014 | Chen et al. |
| 2014/0312427 A1 | 10/2014 | Maeda et al. |
| 2015/0214105 A1 | 7/2015 | Zhang et al. |
| 2015/0263003 A1 | 9/2015 | Lee et al. |
| 2015/0340465 A1* | 11/2015 | Harley ............. H01L 29/66636 438/299 |
| 2016/0322493 A1 | 11/2016 | Wang et al. |

FOREIGN PATENT DOCUMENTS

| | | |
|---|---|---|
| TW | 201338165 A | 9/2013 |
| TW | 201432912 A | 8/2014 |

\* cited by examiner

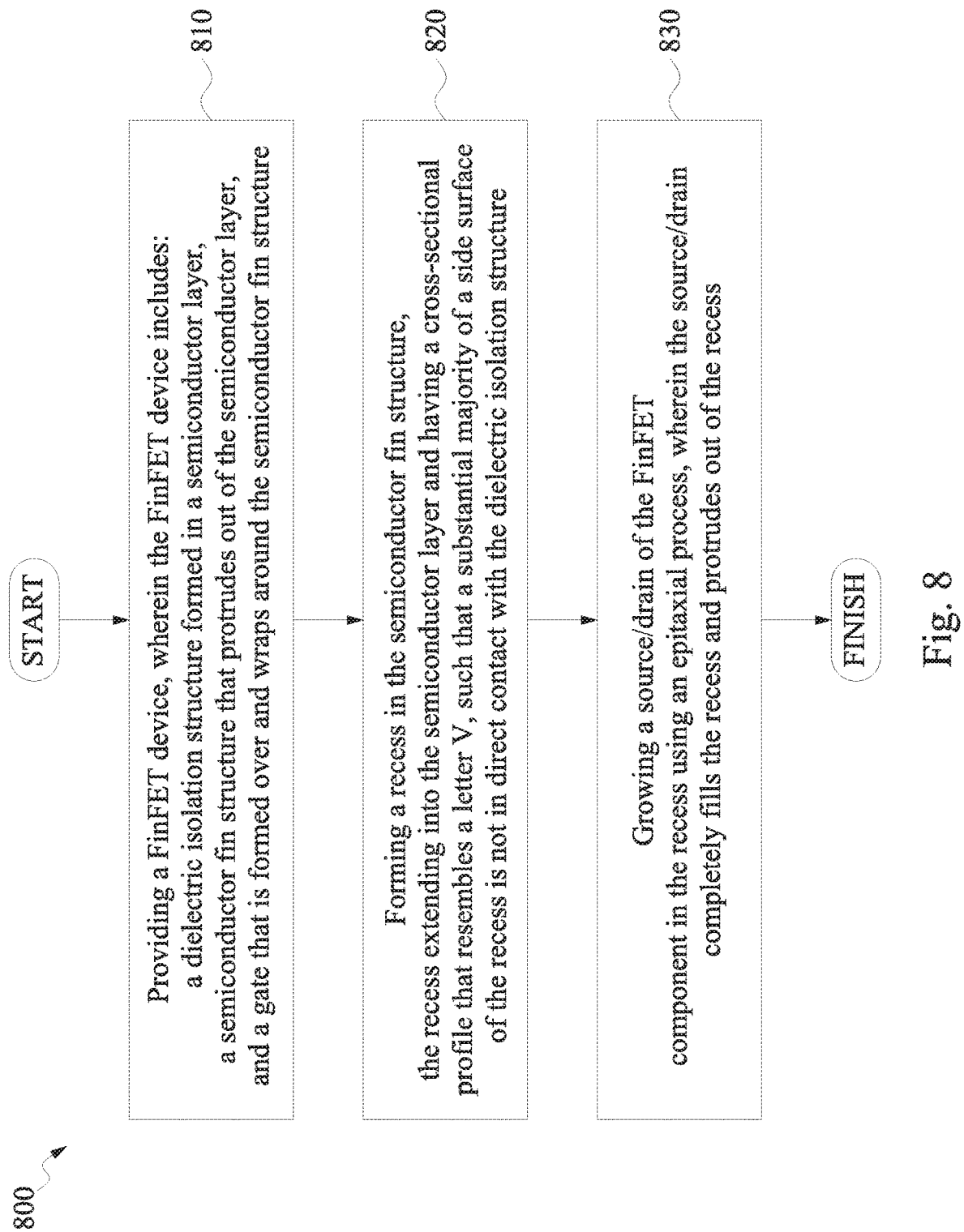

US 10,763,366 B2

V-SHAPE RECESS PROFILE FOR EMBEDDED SOURCE/DRAIN EPITAXY

This application is a divisional of U.S. application Ser. No. 16/048,822, filed Jul. 30, 2018, which is a continuation of U.S. application Ser. No. 15/235,899, filed Aug. 12, 2016, now U.S. Pat. No. 10,038,095, issued Jul. 31, 2018, which claims priority to U.S. Provisional Patent Application Ser. No. 62/287,972, filed on Jan. 28, 2016, the entire disclosures of which are hereby incorporated herein by reference.

BACKGROUND

The semiconductor industry has progressed into nanometer technology process nodes in pursuit of higher device density, higher performance, and lower costs. As this progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow.

However, conventional FinFET devices may still have certain problems. For example, conventional FinFET devices may still suffer from problems such as dislocation, surface contamination, and/or leakage current.

Therefore, while existing FinFET devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 8 is a flowchart illustrating a method of fabricating a semiconductor device in accordance with various embodiments of the present disclosure.

DETAILED DESCRIPTION

Figure 1:
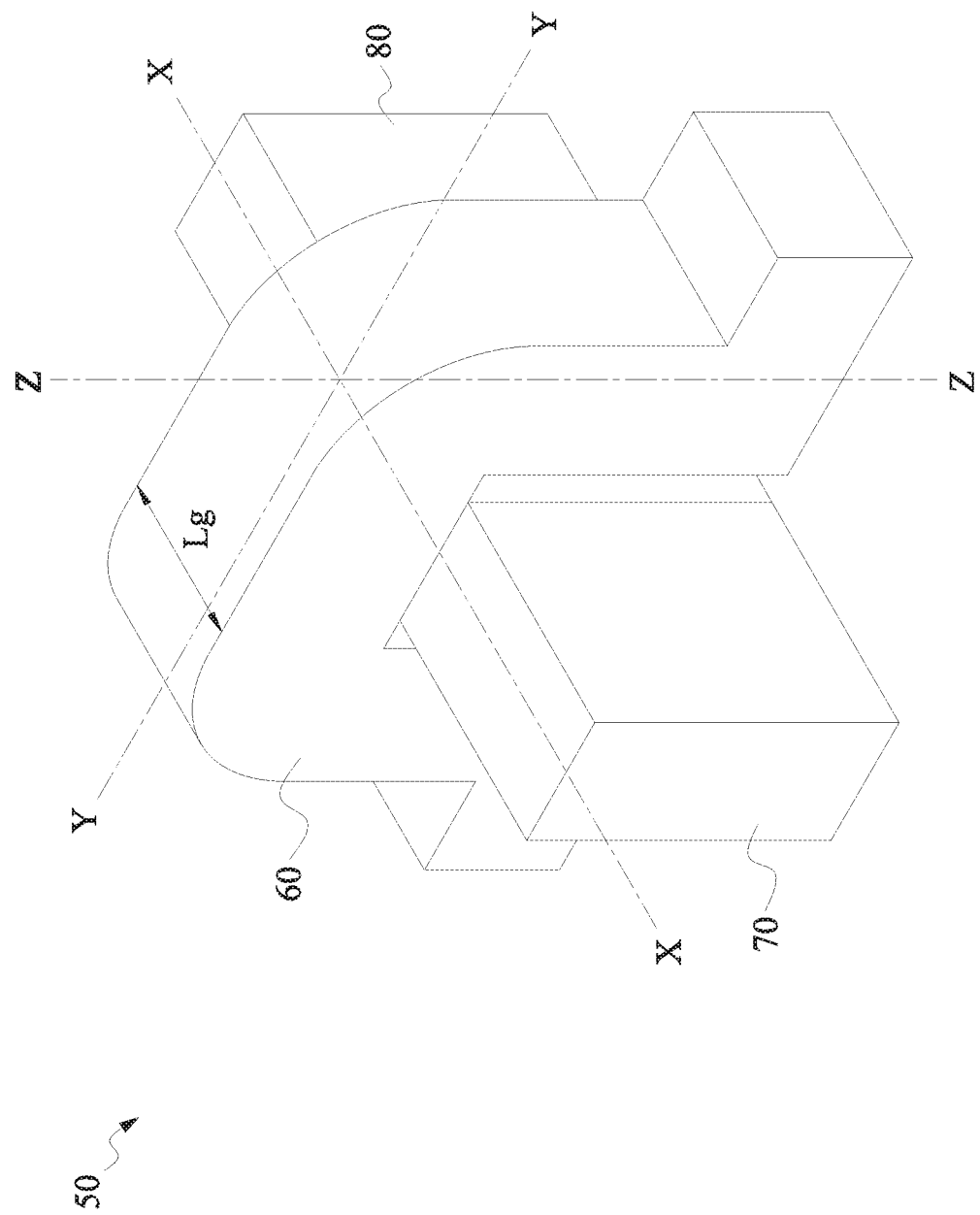
FIG. 1 is a perspective view of a FinFET device as an example semiconductor device in accordance with embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present invention. It is understood, however, that the application should not be limited to a particular type of device, except as specifically claimed.

The use of FinFET devices has been gaining popularity in the semiconductor industry. Referring to FIG. 1, a perspective view of an example FinFET device 50 is illustrated. The FinFET device 50 is a non-planar multi-gate transistor that is built on a substrate. A thin silicon "fin-like" structure (referred to as fin) forms the body of the FinFET device 50. A gate 60 of the FinFET device 50 is wrapped around this fin. Lg denotes a length (or width, depending on the perspective) of the gate 60. A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOS-FET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, various FinFET fabrication method is still under development. For example, it is found that there are several disadvantages if the flat-shape of embedded source/drain epi contains no remaining silicon. One disadvantage is that epitaxy directly grown on flat silicon makes it easy to touch adjacent oxide, which generates dislocation. In addition, this design leads to more damage of solid phase doping (SPD) of Fin, which leads to worse surface contamination. Furthermore, because there is no silicon remaining (since the epi-layer may be grown on a flat silicon surface), then no silicon could be doped to prevent leakage current.

Figure 2:
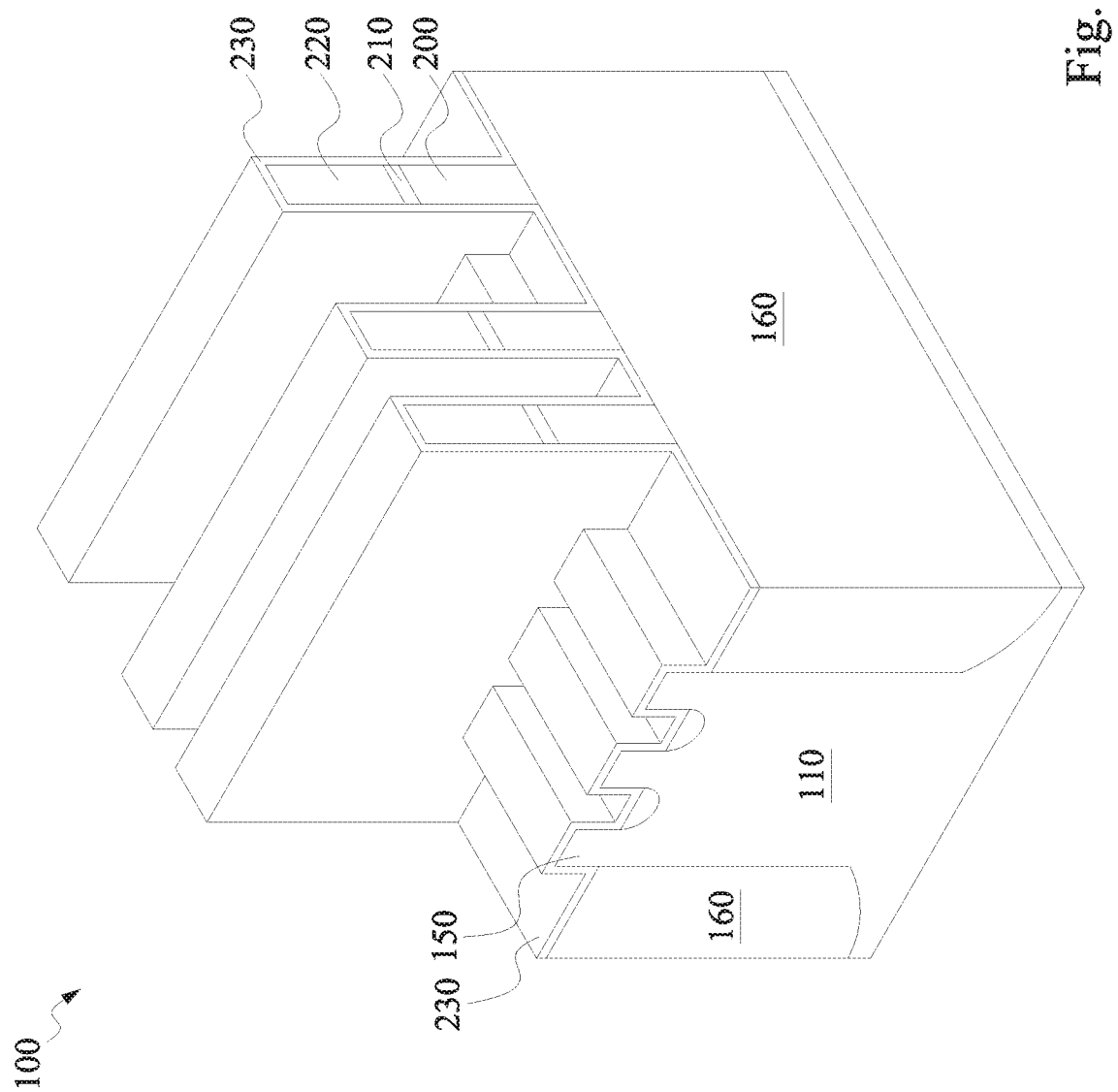
FIGS. 2-5 illustrate perspective views of a FinFET device at various stages of fabrication in accordance with embodiments of the present disclosure.

The present disclosure involves implementing a V-shape design of embedded source/drain epi-layer to overcome the problems discussed above. Referring to FIG. 2, a perspective view of an example FinFET device 100 is illustrated. The FinFET device 100 is fabricated over a substrate, which is not specifically illustrated herein for reasons of simplicity. In some embodiments, the substrate includes a dielectric material, for example silicon oxide ($SiO_2$).

The FinFET device 100 includes a semiconductor layer 110 that is formed on the substrate. In an embodiment, the semiconductor layer 110 includes a crystal silicon material. An implantation process may be performed to implant a plurality of dopant ions to the semiconductor layer 110. The dopant ions may include an n-type material in some embodiments, for example arsenic (As) or phosphorous (P), or they may include a p-type material in some other embodiments, for example boron (B), depending on whether an NMOS or a PMOS is needed. After the implantation process is performed, a doping concentration level in the semiconductor layer 110 is in a range from about $1 \times 10^{17}$ ions/cm$^3$ to about $5 \times 10^{19}$ ions/cm$^3$.

The FinFET device 100 includes a plurality of fin structures 150. The fin structures 150 may be formed by one or more patterning processes, which may involve using photoresists and/or hard masks to define the fin structures 150. For example, the fin structures 150 may be formed by etching away portions of the layer 110.

The FinFET device 100 includes isolation structures 160 formed in the semiconductor layer 110. The isolation structures are electrically isolate the fins 150. The isolation structures 160 may also be referred to as shallow trench isolation (STI) structures. In some embodiments, the isolation structures 160 contain a dielectric material such as silicon oxide or silicon nitride.

The FinFET device 100 includes a plurality of gate structures 200 formed over the semiconductor layer 110 and over the isolation structures 160. The gate structures 200 may be formed by one or more patterning processes. For example, a gate electrode material (e.g., polysilicon) is formed over the isolation structures 160. A patterned hard mask is formed over the gate electrode material. The patterned hard mask includes a dielectric layer 210 and a dielectric layer 220. In some embodiments, the dielectric layer 210 may contain silicon nitride, and the dielectric layer 220 may contain silicon oxide. The patterned hard mask is then used to pattern (e.g., by one or more etching processes) the polysilicon material below to form the gate structures 200. As is shown in FIG. 2, the gate structures 200 are each formed to wrap around the fin structures 150. It is also understood that the gate structures 200 may include a gate dielectric layer formed below the gate electrode material, but this is not specifically illustrated for the sake of simplicity.

Still referring to FIG. 2, a sealing layer 230 is formed over the isolation structures 160, the fin structures 150, and the gate structures 200. In some embodiments, the sealing layer 230 contains silicon carbon oxynitride (SiCON). In other embodiments, the sealing layer 230 contains silicon oxycarbide (SiOC).

Figure 3:
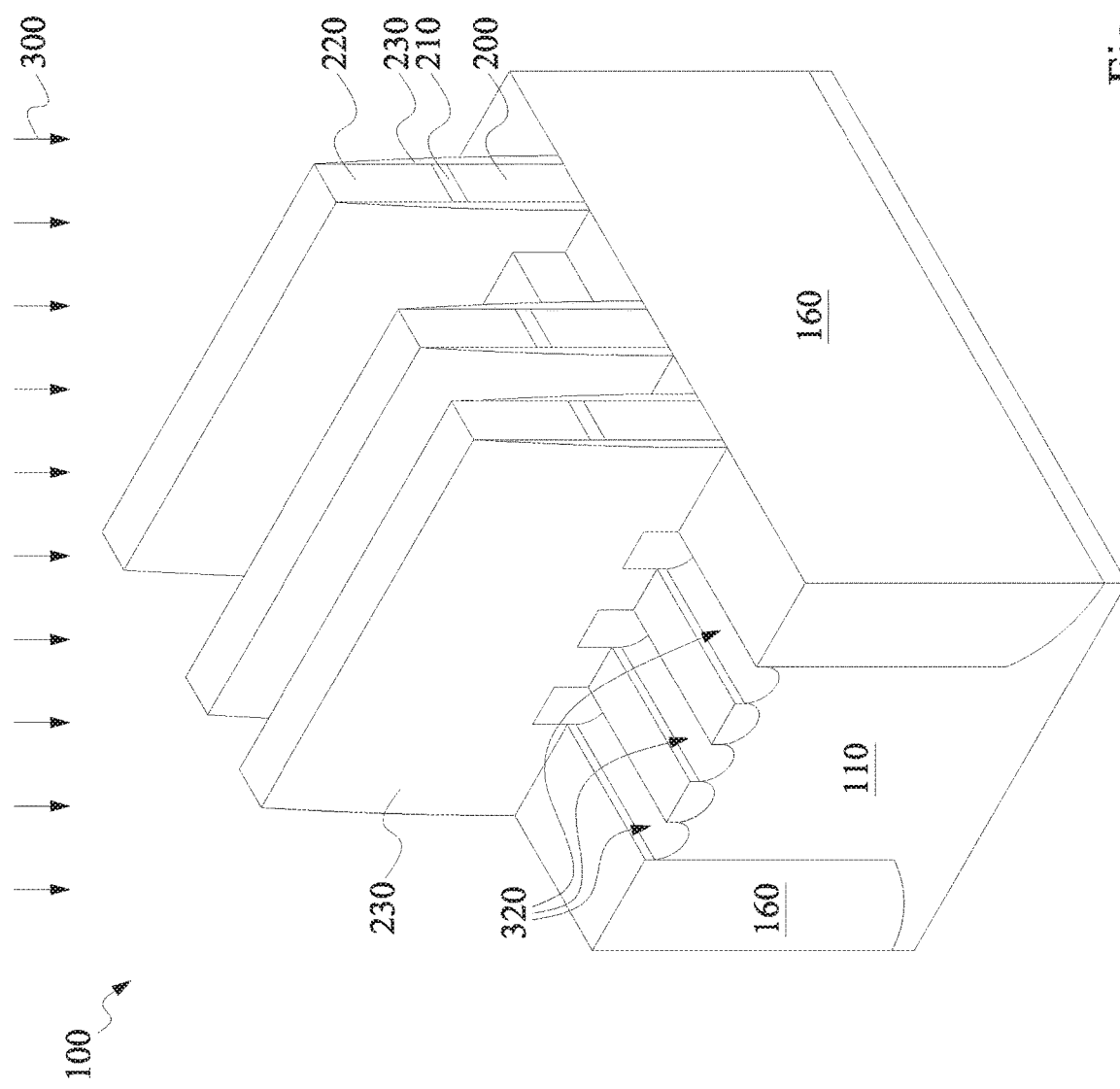

Referring now to FIG. 3, a process 300 is performed to form recesses 320. The recesses 320 are formed by etching the portions of the fin structures 150 that are not wrapped under the gate structures 200 (e.g., portions of the fin structures 150 disposed between and on either side of the gate structures 200). As a result of the etching process 300, the fin structures 150 are etched away and are replaced by the recesses 320, and the recesses 320 also extend downwardly into the semiconductor layer 110. In some embodiments, the etching process 300 include a dry etching process or dry etching+wet etching (e.g., NH4OH) processes. The configurable dry etching process parameters include carrier gas (e.g., $NF_3/CL_2$, HBr/He, etc.), process temperature, and plasma power.

The etching process 300 is specifically configured so that a unique profile is achieved for each of the recesses 320. In more detail, the recesses 320 each have a cross-sectional profile that becomes narrower the further it extends into the semiconductor layer 110. In other words, the cross-sectional profile for each of the recesses is such that it is wider at its top and narrower at its bottom. In some embodiments, the cross-sectional profile resembles a letter "V". In some other embodiments, the cross-sectional profile may take on a different shape, as long as a substantial majority of the side surfaces of the recesses 320 are surfaces of the semiconductor layer 110 and are free of being in direct physical contact of the isolation structures 160. Alternatively stated, the surfaces of the recesses 320 are from the semiconductor layer 110.

This unique profile is configured to avoid dislocation defects in a subsequent epitaxial growth process. For example, in an epitaxial growth process discussed below, an epi-layer is grown in each of the recesses 320 (on the exposed surfaces of the semiconductor layer 110). This epi-layer may serve as the source/drain of the FinFET device 100. Thus, the epitaxial growth should be as defect-free as possible to ensure high quality source/drain formation, which would improve the performance of the FinFET device 100. However, if the etching process 300 had not been specifically configured to achieve the unique cross-sectional profile for the recesses 320, then the etching process would have exposed a substantial or significant portion of the side surfaces of the isolation structures 160. When this occurs, the epitaxial growth process performed subsequently may encounter problems.

For example, the isolation structures 160 contain a dielectric material such as silicon oxide, which is not a crystal structure. A crystal material cannot be formed directly on the exposed surfaces of the isolation structures 160. As such, the epitaxially grown layer (grown from the semiconductor layer 110) in the recesses 320 may suffer from dislocation issues due to the incompatibility with the isolation structures 160. These dislocation issues may lower the yield of the FinFET fabrication, and/or worsen the device performance. Another possible negative effect is damage of layer of solid phase doping on the FinFET device.

In comparison, the present disclosure achieves a profile for the recesses 320 such that the recesses 320 mostly expose the surfaces of the semiconductor layer 110, rather than exposing the surfaces of the isolation structures 160. As such, the epitaxial growth process subsequently performed can have improved growth quality, since the epi-layer does not need to be in direct physical contact with the (non-crystal) isolation structures 160. This eliminates or reduces the dislocation defect that otherwise plagues conventional FinFET fabrication, since conventional FinFET fabrication processes either do not specifically tune the etching process parameters to form the unique profile of the recesses 320 (i.e., their recesses would look quite different from the recesses 320 herein), or lack the etching process to form a recess altogether. Therefore, the FinFET device 100 formed according to the various aspects of the present disclosure has improved device quality and performance compared to conventional FinFET devices.

Figure 4:
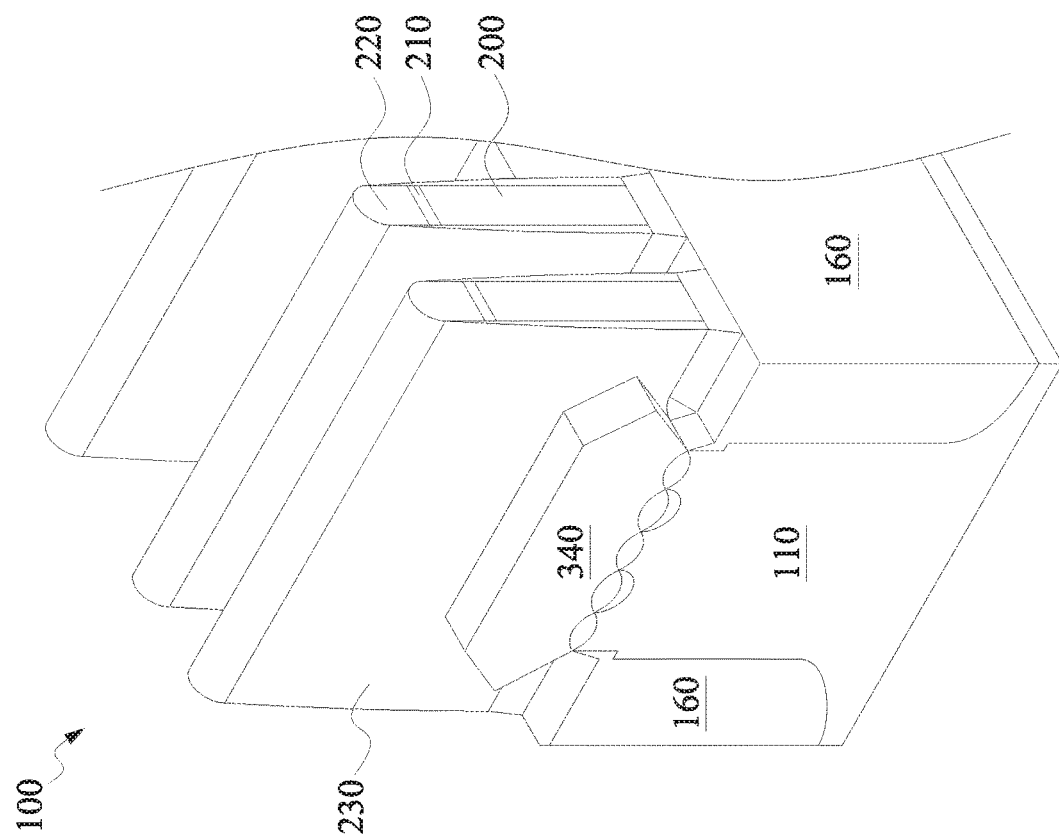
Figure 5:
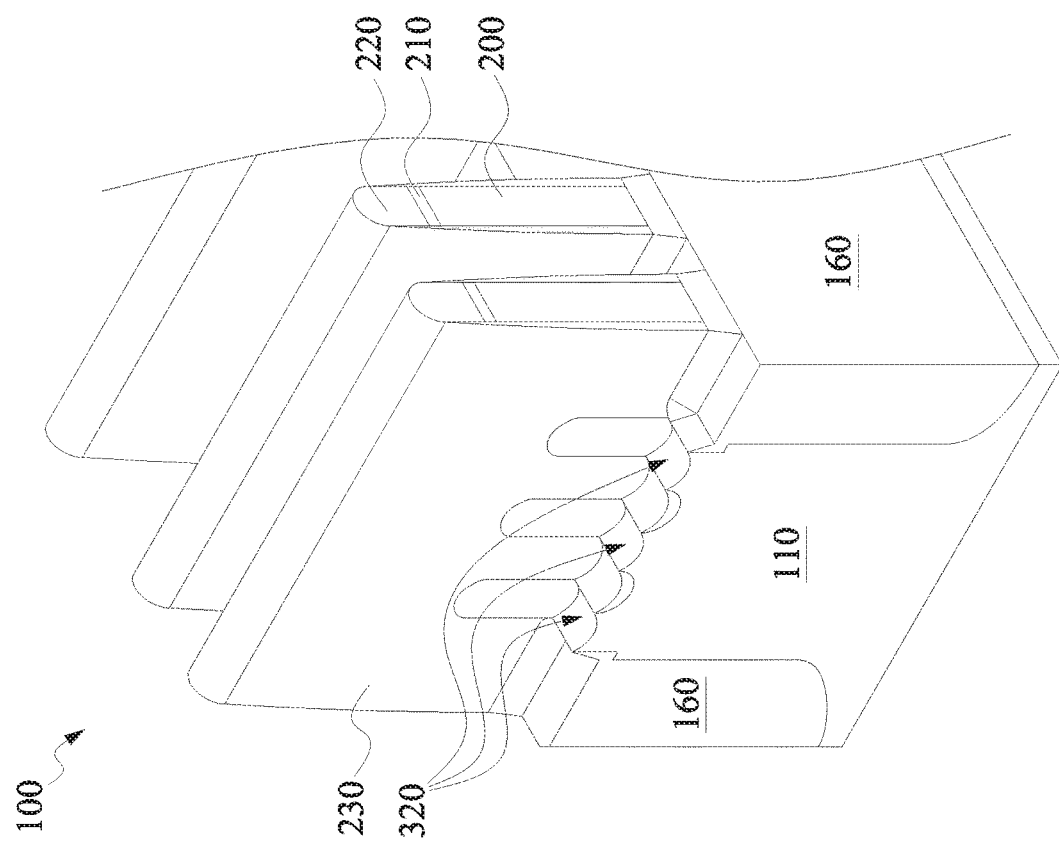

FIGS. 4-5 provide more detailed 3-dimensional illustrations of a portion of the FinFET device 100 before and after the epitaxial growth process, so as to better illustrate the various aspects of the present disclosure discussed above. In more detail, FIG. 4 generally corresponds with FIG. 3, but it is shown in more detail (i.e., more "zoomed-in"). For reasons of clarity and consistency, the same elements appearing in FIGS. 2-5 are labeled the same. As is shown in FIG. 4, the recesses 320 are formed by the etching process 300 (discussed above with reference to FIG. 3) to expose portions of the semiconductor layer 110. The recesses 320 each have a profile such that it is wider at the top becomes narrower toward the bottom, for example resembling a letter "V". The surfaces of the recesses 320 are formed mostly by the exposed portions of the semiconductor layer 110, and not by the surfaces of the isolation structure 160.

Referring now to FIG. 5, an epi-layer component 340 is formed via an epitaxial growth process. The epi-layer component 340 is grown from the exposed surfaces of the semiconductor layer 110 (exposed by the recesses 320). In some embodiments, the epi-layer component 340 contains silicon germanium (SiGe). In some other embodiments, the epi-layer component 340 contains silicon phosphide (SiP). The epi-layer component 340 fills the recesses 320, and thus it may be said that the epi-layer component has bottom portions or segments that take on (or inherit) the shape and/or profile of the recesses (e.g., V-shaped). The remaining portion of the epi-layer component 340—located above these V-shaped bottom portions—has a cross-sectional profile that protrudes laterally outward near the middle. It is understood that the epi-layer component 340 may serve as a source/drain of the FinFET device 100. Since the profile of the recesses 320 allows the epi-layer component 340 to be formed with minimal dislocation defects (e.g., due to it not being in direct physical contact with the isolation structures 160), the performance of the FinFET device 100 is enhanced.

Figure 6:
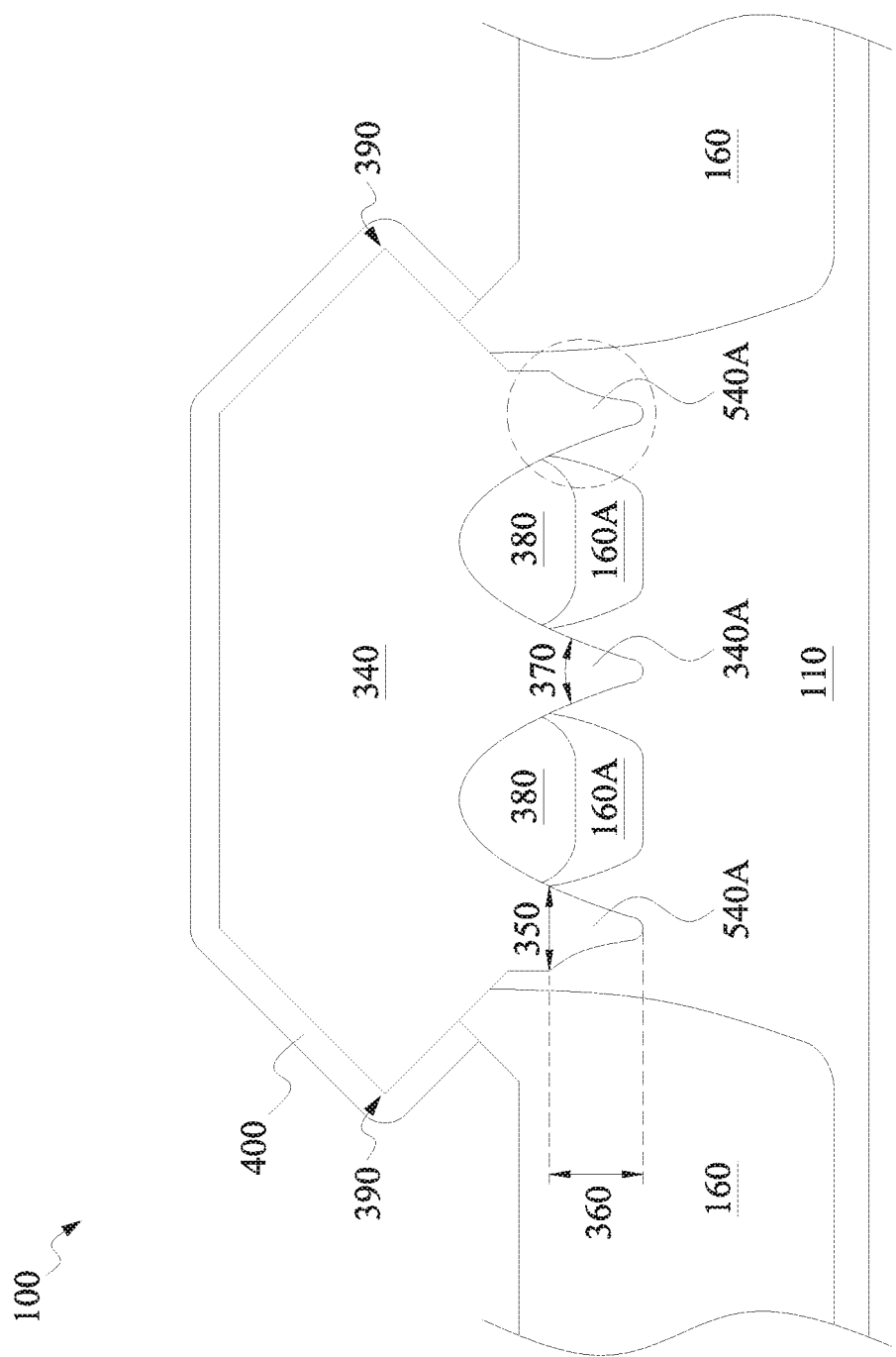
FIGS. 6-7 are different cross-sectional side views of a FinFET device in accordance with various embodiments of the present disclosure.

FIG. 6 is a fragmentary cross-sectional side view of a portion of the FinFET device 100, so as to illustrate the unique profile of the recess and the epi-layer component 340 in more detail. Again, for reasons of clarity and consistency, the same elements appearing in FIGS. 2-6 are labeled the same.

In FIG. 6, the portions of the epi-layer component 340 filling the recesses 320 discussed above are labeled as portions or segments 340A. It may be said that the portions 340A of the epi-layer component are "embedded" in the semiconductor layer 110 (the portions 340A may be interchangeably referred to as the embedded epi-layer segments 340 hereinafter). For example, these embedded epi-layer segments 340A extend downwardly into the semiconductor layer 110, while being surrounded laterally by the semiconductor layer 110. These embedded epi-layer segments 340 are also separated from one another horizontally by portions of the isolation structure (labeled as 160A) that are located in the semiconductor layer 110. In other words, a respective one of the isolation structures 160A (e.g., containing a dielectric material such as silicon oxide) is disposed between each adjacent pair of embedded epi-layer segments 340A. Meanwhile, the rest of the epi-layer component 340 (or the remaining portion) is disposed above the portions 340A and above the semiconductor layer 110 or the isolation structure 160.

In some embodiments, a substantial majority (e.g., at least 90%) of the surfaces (e.g., sidewall surfaces) of the portions 340A of the epi-layer component are free of being in direct physical contact with the isolation structures 160. In other words, most (or all) of the sidewall surfaces of the embedded portions 340A of the epi-layer component are not contiguous with the sidewall surfaces of the isolation structures 160 or 160A.

In some embodiments, the cross-sectional profile of the embedded epi-layer segments 340A is V-shaped (i.e., resembling the letter V). For example, each embedded epi-layer segment 340A is wider at its top and becomes narrower the further it extends into the semiconductor layer. A lateral dimension 350 defines the maximum width of the embedded epi-layer segment 340A. In some embodiments, the lateral dimension 350 may be measured from the point (or interface) of the epi-layer component 340 that comes into direct contact with the isolation structures 160 or 160A on either side. The lateral dimension 350 may also be referred to as a critical dimension of a fin (mathematically expressed as Fin_CD) for the FinFET device 100. Meanwhile, a vertical dimension 360 defines the depth of each embedded epi-layer segment 340A. The vertical dimension 360 may be measured from a bottommost tip of the embedded epi-layer segment to a line corresponding to where the lateral dimension 350 is measured. The vertical dimension 360 may also be mathematically expressed as V_HT.

In some embodiments, the etching process 300 discussed above is configured such that the recess is formed to result in a certain ratio range between the vertical dimension 360 and the lateral dimension 350. For example, in some embodiments, the vertical dimension 360 is greater than about ½ of the lateral dimension. This relationship may be also expressed mathematically as $V\_HT > \frac{1}{2} * Fin\_CD$. In some embodiments, V_HT is in a range from about 5 nanometers to about 20 nanometers, and the Fin_CD is in a range from about 5 nanometers to about 15 nanometers. In some embodiments, the embedded epi-layer segment 340A is also formed to have an upwardly-facing angle 370. For example, the angle 370 may be defined by the two side walls of the embedded epi-layer segment 340A. The angle 370 may be in a range that is less than about 120 degrees, for example between 1 degree and 120 degrees. These ranges (both in numerical numbers and in ratios/relationship) are not trivial, but rather is specifically tuned so as to optimize the performance of the FinFET device 100. For example, it ensures that a sufficient amount of the epi-layer is embedded in the semiconductor layer 110 for better epitaxial growth and better device performance.

As discussed above, this unique profile of the embedded epi-layer segments 340A is achieved by specifically configuring the process parameters of the etching process 300 to define the unique profile for the recesses 320. One benefit of this is the reduced dislocation defects, since the epi-layer component 340 (e.g., the embedded segments 340A) does not need to be in direct contact with the isolation structures 160, which do not have crystal structures and thus may cause the crystal-structured epi-layer segments 340A to get dislodged. Here, since the epi-layer component 340 does not need to come into direct contact with the isolation structure 160, physical dislocation of the epi-layer segment 340 is unlikely. Another benefit of the unique shape design of the embedded epi-layer segment 340A is that there is more remaining silicon seat (e.g., the surfaces of the semiconductor layer 110 exposed by the recesses 320) for better epitaxial growth. Yet another benefit is that the more available remaining silicon area could be doped to prevent leakage current. As a result, the FinFET device 100 has better DC/AC device performance in certain applications.

Also as shown in FIG. 6, a plurality of air gaps or air voids 380 are trapped between the epi-layer component 340 and the isolation structures 160A. The formation of the air gaps 380 is a result of the epitaxial growth process, where the epi-layer material is grown out of the recesses 320 (but not on the isolation structures 160/160A) and merge together upward to form the epi-layer component 340. The merging of the epi-layer material may occur above the isolation structures 160A, and thereby leading to the formation of the air gaps 380. The formation of the air gaps 380 offer improvements, as the air gaps 380 reduce gate-to-source/drain coupling capacitance. The smaller such capacitance is, the faster the transistor speed.

The epi-layer component 340 is also formed to have a cross-sectional profile such that it protrudes laterally outward in the middle. The top and bottom portions of the epi-layer component 340 are narrower than at the middle where it protrudes outward. For example, the epi-layer component 340 has laterally-protruding portions 390, which is where the epi-layer component has its maximum width. A capping layer 400 is formed on the epi-layer component 340. The capping layer 400 may contain silicon or silicon germanium. The capping layer 400 protects the epi-layer component 340 therebelow.

Figure 7:
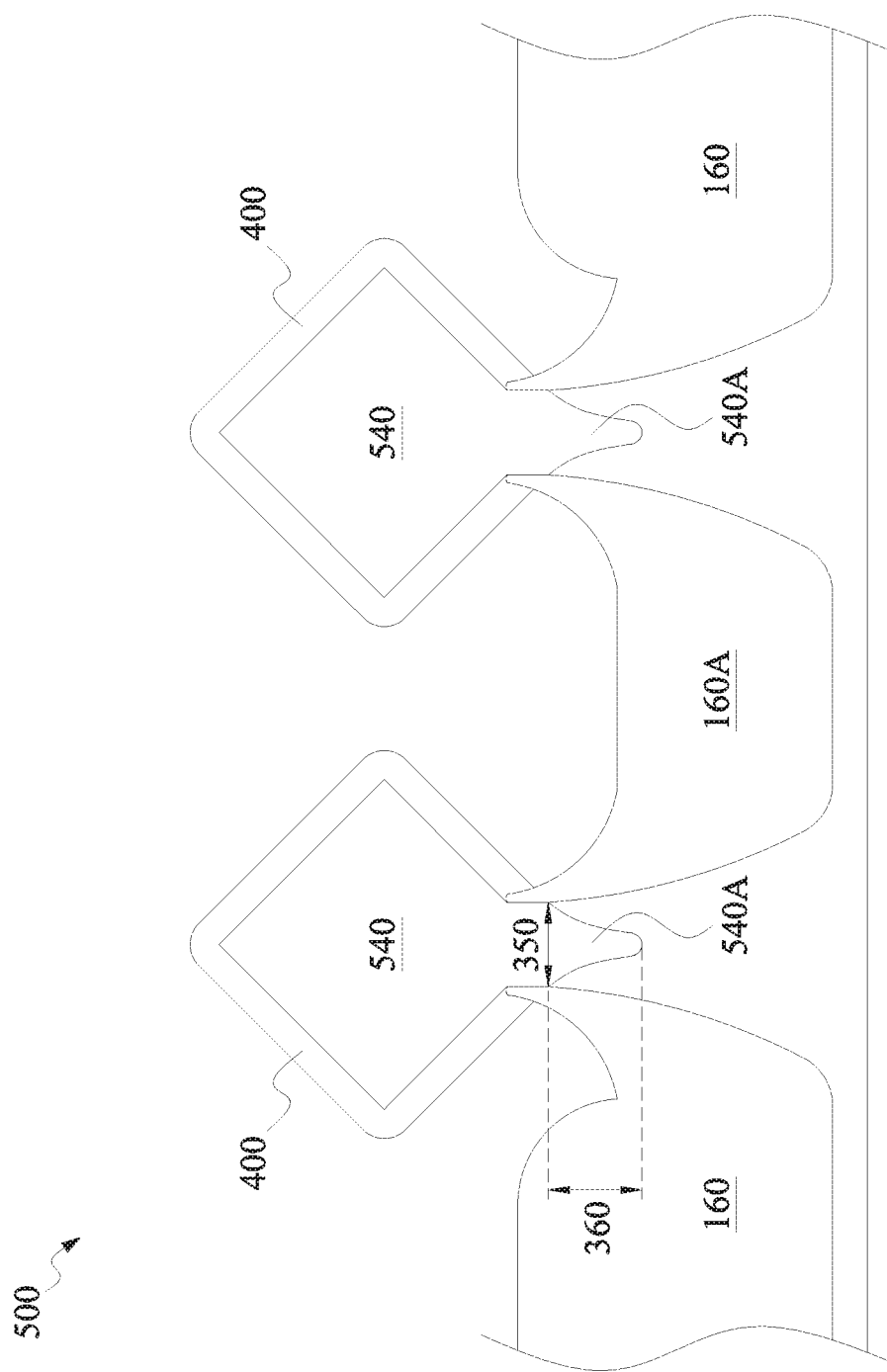

FIG. 7 illustrates another embodiment of a FinFET device 500. The FinFET device 500 is formed using processes similar to those discussed above that were used to form the FinFET device 100. However, unlike the FinFET device 100, where a single epi-layer component 340 has a plurality of V-shaped embedded segments 340A, the FinFET device 500 illustrated in FIG. 7 has a plurality of epi-layer components 540 that each have an embedded segment 540A. The rest of the elements that are similar in FinFET devices 100 and 500 are labeled the same for reasons of clarity and consistency. The embodiment of the FinFET device 500 shown in FIG. 7 may be a portion of an SRAM (static random-access memory) device.

As is illustrated in FIG. 7, the embedded epi-layer segment 540A has a substantially similar profile as the embedded epi-layer segment 340A of the FinFET device 100 shown in FIG. 6. In other words, each epi-layer segment 540A may be V-shaped or have another shape so long as a substantial majority of its side surfaces are free of being in direct contact with the isolation structures 160/160A. As discussed above, the shape of the epi-layer segments 540A is determined by an etching process (similar to the etching process 300) used to form recesses having said shape in the semiconductor layer 110. The epi-layer segments 540A are thereafter grown on the crystal surfaces of the semiconductor layer 110 (and thus fill the recesses). The lateral dimension 350 and the vertical dimension 360 of the epi-layer segment 540A may be formed to have similar ranges and/or relationships (e.g., ratios therebetween) as those discussed above with reference to FIG. 6.

Due to the non-direct contact with the isolation structures 160/160A, the formation of the epi-layer component 540 has better epitaxial growth and reduced dislocation defects. Also due to the greater amount of silicon material (e.g., portions of the semiconductor layer 110 that laterally surrounds the epi-layer segments 540A) that could be doped to prevent leakage current, the FinFET device 500 demonstrates better DC/AC device performance.

A remaining portion of the epi-layer component 540 located above the epi-layer segment 540A has a cross-sectional profile that is somewhat different than that of the epi-layer component 340 of FIG. 6. For example, in FIG. 7, the remaining portion of the epi-layer component 540 has a cross-sectional profile that resembles a diamond or a football. In other words, the top and bottom portions of the epi-layer component 540 are somewhat pointy, while its middle portion protrudes laterally outward.

It is understood that additional fabrication processes may be performed to complete the fabrication of the FinFET device 100 or the FinFET device 500. For example, a gate-replacement process may be performed. In a gate replacement process, the gate structures 200 shown in FIG. 5 may be dummy gates, which are removed in a subsequent process. A functional gate is formed to replace each of the removed dummy gates. In some embodiments, the functional gate has a high-k gate dielectric (e.g., a dielectric material having a dielectric constant greater than that of silicon oxide) and a metal gate electrode. In some embodiments, the high-k gate dielectric may contain $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO. In some embodiments, the metal gate electrode may contain Al, W, Cu, TiAlN, TaCN, TiN, WN, W or combinations thereof. The details of the gate replacement process (as well as other additional processes performed to complete the fabrication of the FinFET device) are described in U.S. patent application Ser. No. 14/885,115, filed on Oct. 16, 2015, entitled "Method of Tuning Source/Drain Proximity For Input/Output Device Reliability Enhancement", the contents of which are hereby incorporated by reference in its entirety.

FIG. 8 is a flowchart of a method 800 of fabricating a semiconductor device in accordance with various aspects of the present disclosure. The method 800 includes a step 810 of providing a FinFET device. The FinFET device includes: a dielectric isolation structure formed in a semiconductor layer, a semiconductor fin structure that protrudes out of the semiconductor layer, and a gate that is formed over and wraps around the semiconductor fin structure.

The method 800 includes a step 820 of forming a recess in the semiconductor fin structure. The recess is formed using an etching process that includes a dry etching component. The recess extends into the semiconductor layer and has a cross-sectional profile that resembles a letter V, such that a substantial majority of a side surface of the recess is not in direct contact with the dielectric isolation structure. In some embodiments, the recess is formed such that it defines an upwardly-facing angle that is less than about 120 degrees. In some embodiments, the recess is formed such that a depth of the recess is greater than about ½ of a width of the recess.

The method 800 includes a step 830 of growing a source/drain of the FinFET component in the recess using an epitaxial growth process. The source/drain completely fills the recess and protrudes out of the recess. In some embodiments, the growing the source/drain is performed such that a portion of the source/drain that protrudes out of the recesses traps an air gap underneath.

It is understood that additional process steps may be performed before, during, or after the steps 810-830 discussed above to complete the fabrication of the semiconductor device. For example, the first gate and the second gates may be dummy gates, in which case the method 800 may include a step of replacing the dummy gates with high-k metal gates. Other process steps are not discussed herein for reasons of simplicity.

The present disclosure offers advantages over conventional FinFET and the fabrication thereof. It is understood, however, that other embodiments may offer additional advantages, and not all advantages are necessarily disclosed herein, and that no particular advantage is required for all embodiments. One advantage is that the V-shape design of the embedded source/drain epi components of the FinFET device of the present disclosure provides more silicon seat for better epitaxial growth. It also eliminates or reduces the dislocation defects due to the epi-layer not being in physical contact with adjacent dielectric material. The V-shape design of embedded source/drain epi-layer also provides more remaining silicon area, which could be doped to prevent leakage current, and therefore the FinFET device demonstrates better DC/AC device performance.

One embodiment of the present disclosure includes a semiconductor device. The semiconductor device includes a semiconductor layer. An isolation structure is formed in the semiconductor layer. An epi-layer component is formed on the semiconductor layer. The epi-layer component includes a first portion that extends into the semiconductor layer. A lateral dimension of the first portion of the epi-layer component decreases as the first portion extends further into the semiconductor layer. A substantial majority of a side surface of the first portion of the epi-layer component is free of being in direct contact with the isolation structure.

Another embodiment of the present disclosure includes a semiconductor device. The semiconductor device includes a semiconductor base. A dielectric isolation structure is formed in the semiconductor base. A source/drain of a FinFET transistor is formed on the semiconductor base. A bottom segment of the source/drain is embedded into the semiconductor base. The bottom segment of the source/drain has a V-shaped cross-sectional profile. The bottom segment of the source/drain is separated from the dielectric isolation structure by portions of the semiconductor base.

Yet another embodiment of the present disclosure includes a method of fabricating a semiconductor device. A FinFET device is provided. The FinFET device includes: a dielectric isolation structure formed in a semiconductor layer, a semiconductor fin structure that protrudes out of the semiconductor layer, and a gate that is formed over and wraps around the semiconductor fin structure. A recess is formed in the semiconductor fin structure. The recess extends into the semiconductor layer and has a cross-sectional profile that resembles a letter V, such that a substantial majority of a side surface of the recess is not in direct contact with the dielectric isolation structure. A source/drain of the FinFET device is grown in the recess using an epitaxial process. The source/drain fills the recess and protrudes out of the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor material;
    a first epi-layer and a second epi-layer each disposed over the semiconductor material, wherein the first epi-layer includes a protruding portion that protrudes into the semiconductor material, wherein a lateral dimension of the protruding portion decreases as the protruding portion protrudes further into the semiconductor material, wherein the second epi-layer includes a V-shaped portion that protrudes downwardly into the semiconductor material, and wherein the first epi-layer and the second epi-layer are laterally separated from each other; and
    an isolation structure disposed adjacent to the protruding portion of the first epi-layer and between the first epi-layer and the second epi-layer, wherein an upper surface of the isolation structure is disposed below an upper surface of the first epi-layer.

2. The semiconductor device of claim 1, wherein the first epi-layer is a source/drain of a transistor.

3. The semiconductor device of claim 1, wherein: a portion of the semiconductor material is disposed between the isolation structure and the protruding portion of the first epi-layer.

4. The semiconductor device of claim 3, wherein the semiconductor material prevents a direct physical contact between the isolation structure and a substantial majority of a side surface of the protruding portion facing the isolation structure.

5. The semiconductor device of claim 1, wherein the protruding portion of the first epi-layer has a cross-sectional profile that resembles a letter V.

6. The semiconductor device of claim 1, wherein a bottom surface of the isolation structure is disposed below a bottom surface of the protruding portion of the first epi-layer.

7. The semiconductor device of claim 1, wherein the upper surface of the isolation structure is recessed downwardly.

8. The semiconductor device of claim 1, wherein the isolation structure includes a shallow trench isolation (STI) and contains silicon oxide or silicon nitride.

9. The semiconductor device of claim 1, further comprising: a capping layer disposed on the first epi-layer.

10. The semiconductor device of claim 1, wherein a portion of the first epi-layer disposed over the protruding portion has a lateral dimension that varies depending on height.

11. The semiconductor device of claim 10, wherein the portion of the first epi-layer disposed over the protruding portion has a cross-sectional profile that resembles a diamond.

12. A semiconductor device, comprising:
    a semiconductor material;
    a first source/drain of a transistor disposed over the semiconductor material, wherein a first segment of the first source/drain protrudes downwardly into the semiconductor material;
    a second source/drain of a transistor disposed over the semiconductor material, wherein a second segment of the second source/drain protrudes downwardly into the semiconductor material, wherein the first segment and the second segment each have a V-shape cross-sectional profile, and wherein the second source/drain is spaced apart from the first source/drain; and
    a dielectric structure disposed in the semiconductor material and between the first segment of the first source/drain and the second segment of the second source/drain;
    wherein:
    a majority portion of a side surface of the first segment is separated from the dielectric structure by a portion of the semiconductor material; or a majority portion of a side surface of the second segment is separated from the dielectric structure by a portion of the semiconductor material.

13. The semiconductor device of claim 12, wherein the dielectric structure has a concave cross-sectional profile.

14. The semiconductor device of claim 12, wherein the first source/drain and the second source/drain each have a laterally protruding middle portion.

15. The semiconductor device of claim 12, further comprising a first capping layer formed over the first source/drain and a second capping layer formed over the second source/drain.

16. A semiconductor device, comprising:
a semiconductor material;
a first source/drain having a first V-shaped portion embedded in the semiconductor material;
a second source/drain having a second V-shaped portion embedded in the semiconductor material;
a dielectric isolation structure disposed between the first V-shaped portion and the second V-shaped portion;
wherein:
the first source/drain and the second source/drain spaced apart from each other laterally;
a majority of the first source/drain is disposed over the first V-shaped portion and has a substantially greater lateral dimension than the first V-shaped portion;
a majority of the second source/drain is disposed over the second V-shaped portion and has a substantially greater lateral dimension than the second V-shaped portion;
sidewalls of the dielectric isolation structure are separated from sidewalls of the first V-shaped portion and sidewalls of the second V-shaped portion by portions of the semiconductor material; and
the dielectric isolation structure has a recessed upper surface.

17. The semiconductor device of claim 16, further comprising: a capping layer disposed on each of the first source/drain and the second source/drain.

18. The semiconductor device of claim 16, wherein the majority of the first source/drain disposed over the first V-shaped portion has a laterally-protruding cross-sectional profile.

19. The semiconductor device of claim 12, wherein bottommost tip of the first segment or a bottommost tip of the second segment is more elevated than a bottom surface of the dielectric structure.

20. The semiconductor device of claim 16, wherein a bottom surface of the dielectric isolation structure is located below than bottom surfaces of the first source/drain and the second source/drain.

* * * * *